(12) United States Patent
Yahata et al.

(10) Patent No.: US 9,215,815 B2
(45) Date of Patent: Dec. 15, 2015

(54) DISPLAY APPARATUS AND TELEVISION RECEIVING APPARATUS

(75) Inventors: Mamoru Yahata, Osaka (JP); Shoichiro Takahashi, Osaka (JP); Masaya Sandoh, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 101 days.

(21) Appl. No.: 14/349,263

(22) PCT Filed: Aug. 20, 2012

(86) PCT No.: PCT/JP2012/070967
§ 371 (c)(1),
(2), (4) Date: Apr. 2, 2014

(87) PCT Pub. No.: WO2013/051347
PCT Pub. Date: Apr. 11, 2013

(65) Prior Publication Data
US 2014/0232942 A1      Aug. 21, 2014

(30) Foreign Application Priority Data

Oct. 3, 2011  (JP) .................................. 2011-219507
Apr. 13, 2012  (JP) .................................. 2012-092105

(51) Int. Cl.
| G02F 1/1333 | (2006.01) |
| H05K 5/00 | (2006.01) |
| H04N 5/645 | (2006.01) |

(Continued)

(52) U.S. Cl.
CPC ............... *H05K 5/0017* (2013.01); *H04N 5/64* (2013.01); *H04N 5/645* (2013.01); *H05K 5/0217* (2013.01)

(58) Field of Classification Search
CPC ..... H05K 5/0017; H05K 5/0217; H05K 5/02; H04N 5/645; H04N 5/64; H04N 5/66; G09F 9/00

USPC .................... 349/84, 92; 348/825; 361/679.01
See application file for complete search history.

(56) References Cited

U.S. PATENT DOCUMENTS

2002/0135294 A1* 9/2002 Fujishiro ........... G02F 1/133308
                                                                313/493
2011/0285926 A1* 11/2011 Yokote .................. G06F 1/1601
                                                                348/841

(Continued)

FOREIGN PATENT DOCUMENTS

| JP | 11-4737 A | 1/1999 |
| JP | 2002-190997 A | 7/2002 |

(Continued)

OTHER PUBLICATIONS

International Search Report, issued in PCT/JP2012/070967, dated Oct. 30, 2012.

*Primary Examiner* — Mike Qi
(74) *Attorney, Agent, or Firm* — Birch, Stewart, Kolasch & Birch, LLP

(57) ABSTRACT

Disclosed is a display apparatus, in which a rectangular frame covering a peripheral part of a display unit is divided into four frame members, and when the end portions of the adjacent frame members are connected by connectors at the four corners of a rectangle, the frame members and the connector may be coupled with high positioning accuracy of the frame members and the connector. The connector includes two positioning parts which abut against the respective frame members and to be connected to position the frame members in a respective longitudinal direction thereof, and the frame members and includes a part to be positioned which abuts against the positioning part of the connector, and coupling means and are formed to couple the frame members and with the connector.

20 Claims, 19 Drawing Sheets

(51) Int. Cl.
*H04N 5/64* (2006.01)
*H05K 5/02* (2006.01)

(56) References Cited

U.S. PATENT DOCUMENTS

2013/0050592 A1* 2/2013 Kanzawa ................. H04N 5/64
 348/843
2014/0333844 A1* 11/2014 Ito ........................... H04N 5/64
 348/794

FOREIGN PATENT DOCUMENTS

| | | | |
|---|---|---|---|
| JP | 2002-290873 A | 10/2002 | |
| JP | 2007-171868 A | 7/2007 | |

* cited by examiner

F I G. 5
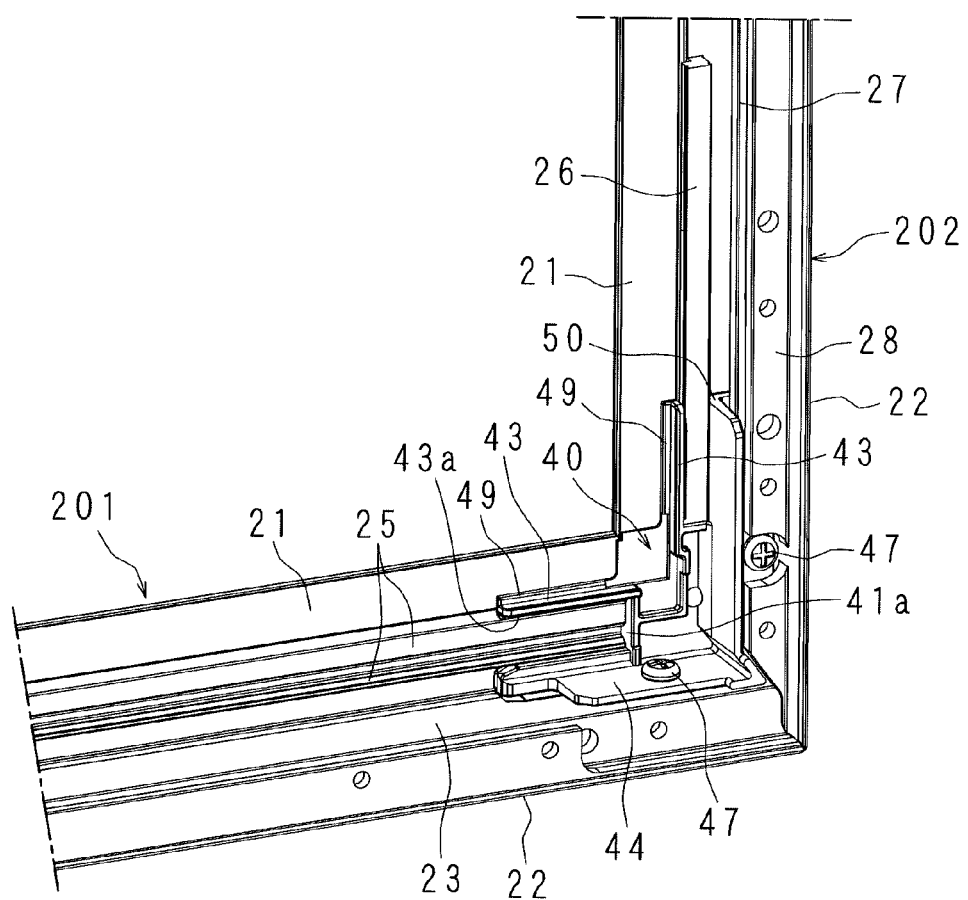

F I G. 6
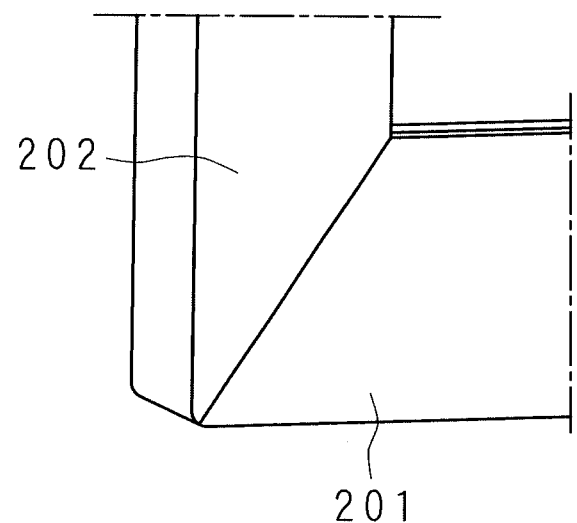

DISPLAY APPARATUS AND TELEVISION RECEIVING APPARATUS

CROSS-REFERENCE TO RELATED APPLICATIONS

This application is the national phase under 35 U.S.C. §371 of PCT International application No. PCT/JP2012/070967 which has an International filing date of Aug. 20, 2012 and designated the United States of America.

BACKGROUND

1. Technical Field

The present invention relates to a display apparatus, in which a rectangular frame covering peripheral edge parts of a display unit is divided into four frame members such that end portions of the adjacent frame members are connected to each other, and a television receiving apparatus including the display apparatus.

2. Description of Related Art

Recently, the size of a thin type television of a liquid crystal display, or the like is becoming larger, and the number of models thereof such as 52, 60 and 70 inch display sizes is increasing as well. In this case, as the display size is becoming larger, and a cabinet (frame body) forming the outer appearance of the television is also becoming larger, but a desire to make the outer size as small as possible is also strong. Therefore, narrow frame products in which the frame part of a rectangular front cabinet located around a display screen is made narrow are also on sale.

In general, the front cabinet is an integrated frame and is manufactured by a mold. The cost of mold is in direct proportion to the size of the front cabinet, and in large models, the cost of the mold becomes higher. Further, in the case of expanding the large models in a plurality of variations, the mold cost is increased by the number of models. Accordingly, it is possible to consider a display apparatus in which the front cabinet is divided into four frame members of top, bottom, left and right, and the end portions of each frame member are connected to each other by L-shaped connectors at four corners. A cathode-ray tube display apparatus, which is not a thin-type television but in which the front cabinet is divided into four frame members of top, bottom, left and right to be connected, is publicly known in the related art (see, Japanese Patent Laid-Open Publication No. 2002-190997). Specifically, ribs (protrusions) are formed on an inner side of plate-shaped frame members, and through-holes are formed in each L-shaped portion of the connectors in contact with the ribs, such that tapping screws passing through the through-holes of the L-shaped connector are screwed to the ribs to connect the frame members to each other.

In addition, a connecting metal fitting for a narrow frame, which is not the display apparatus but in which the frame is divided into four frame members of top, bottom, left and right, is disclosed in the related art (see, Japanese Patent Laid-Open Publication No. 11-004737), wherein each of the frame members having an inwardly opened "U" cross-section shape is provided with concave grooves in inner end edge parts thereof, and the connecting metal fitting has a protrusion piece inwardly protruding on each L-shaped portion thereof, such that each protrusion piece is inserted into each concave groove of the adjacent frame members to connect the frame members to each other.

SUMMARY

In the display apparatus described in Japanese Patent Laid-Open Publication No. 2002-190997, there is a possibility that positioning accuracy of the frame members and the connector is lowered by such as misalignment therebetween occurring in screwing. In the connecting metal fitting described in Japanese Patent Laid-Open Publication No. 11-004737, there is a need to form a gap (allowance) for insertion between an inner peripheral surface of the concave groove and the protrusion piece, in order to insert the protrusion into the concave groove so as to couple the frame members with the connector, thereby it is not possible to increase the positioning accuracy and the coupling strength of the frame members and the connector so much.

Further, as another example of a liquid crystal display apparatus of the related art, there is a display apparatus which includes a panel chassis on which a liquid crystal display panel is mounted, and is configured to cover an optical sheet group, a light guide plate and an LED light source with the panel chassis. In this case, if these optical parts are covered with the panel chassis, light leaking to the outside of the apparatus is prevented. However, recently, in order to make the display apparatus in a thin shape with narrow frame, the number of components is being reduced. As a result, when the panel chassis is removed and the liquid crystal display panel, optical sheet, light guide plate, reflection plate, and the like are directly mounted on the front cabinet, light leaking from a gap formed in the front cabinet may not be prevented.

In consideration of the above-mentioned circumstances, it is an object of the present invention to provide a display apparatus, in which a rectangular frame covering peripheral edge parts of a display unit is divided into four frame members, and when the end portions of the adjacent frame members are connected by connectors at the four corners of a rectangle, the frame members and the connector may be coupled with high positioning accuracy of the frame members and the connector, and a television receiving apparatus including the display apparatus.

According to an aspect of the present invention, there is provided a display apparatus including a display unit, and a rectangular frame which covers peripheral parts of the display unit, wherein the frame has four frame members which form respective sides of a rectangle, and four connectors which connect adjacent end portions of the four frame members, wherein the connector comprises two positioning parts which abut against the respective frame members to be connected so as to position the frame members in the respective longitudinal directions, and the frame member comprises a part to be positioned which abuts against the positioning part, and the display apparatus comprises a coupling means which couples the frame member and the connector together.

According to the present invention, the connector which connects the adjacent end portions of the four frame members forming the respective edges of the rectangular frame includes two positioning parts which abut against the respective frame members to be connected to position the frame members in the respective longitudinal directions thereof, and in a state that a part to be positioned which is provided in one of frame members to be connected abuts against one of the two positioning parts, and a part to be positioned which is provided in the other of frame members to be connected abuts against the other one of the two positioning parts, the respective frame members and the connector are connected each other.

In the display apparatus according to the present invention, the connector has two plate parts elongating respectively in the respective longitudinal directions of the respective frame members to be connected, and the positioning parts are formed respectively by respective notches which are recessed in a concave shape inward from the end edges of the plate parts, and the part to be positioned of the frame member is formed by a protrusion part which protrudes to be fitted to the notch and abuts against a base portion of the notch.

According to the present invention, the connector has two plate parts extending in the respective longitudinal directions of the respective frame members to be connected, and by fitting the protrusion part on the frame member side to the notch of the connector side cutout in a concave shape inward from the end edge of the plate part to abut against the base portion of the notch, positioning of the frame members with the connector is performed in the respective longitudinal directions of the respective frame members.

In the display apparatus according to the present invention, the display unit has a display surface on a front side thereof, and the connector includes a second positioning part configured to position the display unit within a plane parallel to the display surface.

According to the present invention, it is possible to position the display unit within the plane parallel to the display surface of the display unit having the display surface on the front side thereof, by the second positioning part provided in the connector.

In the display apparatus according to the present invention, the connector includes: an edge plate part located on a front side of the peripheral part of the display unit; and a protrusion which protrudes to a rear side of the edge plate part and has a side surface facing a side surface of the display unit to form the second positioning part.

According to the present invention, since the edge plate part of the connector is located on the front side of the peripheral part of the display unit on the inner edge side, and the protrusion protrudes to the rear side of the edge plate part of the inner edge side of the connector, and the second positioning part is formed by the side surface of the protrusion facing the side surface of the display unit, it is possible to reduce the range of covering the display surface by the connector as much as possible and achieve a smaller display unit.

In the display apparatus according to the present invention, the protrusion has a first guide part which is formed by chamfering a rear end portion thereof so as to guide an end portion of the display unit to a position in which the side surface of the end portion faces the side surface of the protrusion.

According to the present invention, since the protrusion is provided with the first guide part formed by chamfering the rear end portion thereof forming the second positioning part so as to guide the side surface of the display unit to the position in which the end portion of the display unit facing the second positioning part, the operation for setting the side surface of the display unit to the position facing the protrusion may be easily performed.

In the display apparatus according to the present invention, the frame member includes: a front plate part facing the front side of the peripheral part of the display unit; and a side plate part which elongates from the front plate part to the rear side to face the side surface of the display unit, and the connector includes a coupling part which is configured to be coupled with the side plate part and forms the coupling means.

According to the present invention, since the frame member includes the front plate part facing the front side of the peripheral part of the display unit, and the side plate part which elongates from the front plate part to the rear side to face the side surface of the display unit, the coupling part included in the connector is coupled with the side plate part, the connector and the frame member are coupled to each other.

In the display apparatus according to the present invention, the coupling part protrudes in a direction parallel to or across the display surface so as to be overlapped on the side plate part, and has a through-hole for screwing formed therein.

According to the present invention, in a state that the coupling part protruding in the direction parallel to or across the display surface is overlapped on the side plate part of the frame member, the connector and the frame member are coupled by screwing a screw passing through the through-hole for screwing which is formed in the coupling part to the side plate part.

In the display apparatus according to the present invention, the connector has a shield part configured to shield a portion in which the end portions of the front plate parts of the frame members are butted.

According to the present invention, since the portion in which the end portions of the front plate parts of the frame members are butted is shielded by the shield part formed in the connector, inside light is blocked by the shield part to prevent from being leaked outside, without using such as a conventional panel chassis. Therefore, light leaking from a gap formed in the portion in which the end portions of the front plate parts of the frame members are butted may be prevented.

In the display apparatus according to the present invention, the shield part elongates inwardly along the display surface of the display unit from the second positioning part.

According to the present invention, since the shield part, which shields the portion in which the end portions of the front plate parts of the frame members are butted, elongates inwardly along the display surface of the display unit from the second positioning part, light leaking near the end portion of the display unit may be reliably prevented.

In the display apparatus according to the present invention, the display unit includes: a display surface on the front side thereof; and an optical sheet disposed on the rear side thereof, and the connector includes a third positioning part configured to position corner portions of the optical sheet.

According to the present invention, it is not necessary to dispose an angle in the frame member and form a concave part in the optical sheet to be fitted to the angle. Therefore, the component costs may be reduced and the optical sheet may be easily mounted on the display unit.

In the display apparatus according to the present invention, the display unit includes: a display surface on the front side thereof; and an optical sheet disposed on the rear side thereof, and the connector includes a third positioning part configured to position corner portions of the optical sheet.

According to the present invention, it is not necessary to dispose the angle in the longitudinal frame member and form a concave part on the optical sheet to be fitted to the angle. Therefore, the component costs may be reduced, and since a concave part forming process is not required and the optical sheet is easily mounted on the display unit, the production costs may be reduced.

In the display apparatus according to the present invention, the connector includes: an edge plate part positioned on the front side of the peripheral part of the display unit; and a protrusion which protrudes to the rear side of the edge plate part and has a side surface facing the side surface of the display unit to position the display unit within the plane parallel to the display surface, and the third positioning part is extended to the protrusion.

According to the present invention, it is not necessary to dispose an angle in the longitudinal frame member and form a concave part on the optical sheet to be fitted to the angle. Therefore, the component costs may be reduced, and since a concave part forming process is not required and the optical sheet is easily mounted on the display unit, the production costs may be reduced.

In the display apparatus according to the present invention, the third positioning part includes a second guide part configured to guide the display unit between the edge plate part and a front side thereof.

According to the present invention, it is possible to dispose an optical sheet behind the display unit immovably with the display unit fixed securely.

The television receiving apparatus according to the present invention including: the display apparatus according to any one of the above; and a receiving unit which receives television broadcasts, wherein the display apparatus is configured to display an image based on the television broadcasts received by the receiving unit.

According to the present invention, the display apparatus according to any one of the above displays the image based on the television broadcasts received by the receiving unit.

In accordance with the display apparatus according to the present invention, the rectangular frame covering the peripheral parts of the display unit is divided into four frame members, so that the end portions of the frame members adjacent to the four corners of a rectangle are connected by connectors. At this time, in the state that each of the two positioning parts provided in the connector abuts against the part to be positioned which is provided in each frame member to be connected so as to position the display unit in each longitudinal direction of each frame member, each frame member and each connector are coupled together. Thus, the present invention provides the display apparatus in which each frame member and each connector may be coupled at a sufficient strength with an increased positioning accuracy therebetween.

In accordance with the television apparatus according to the present invention, a thin type television apparatus having a large display surface on a front side thereof is provided.

The above and further objects and features will more fully be apparent from the following detailed description with accompanying drawings.

BRIEF DESCRIPTION OF THE SEVERAL VIEWS OF THE DRAWINGS

FIG. 5 is a perspective view illustrating an assembled state of the display apparatus shown in FIG. 4;

FIG. 6 is a front perspective view illustrating an outer appearance of a part of the display apparatus shown in FIG. 5;

Hereinafter, the present invention will be described in detail with reference to the accompanying drawings illustrating the embodiments thereof.

EMBODIMENT 1

Figure 1:
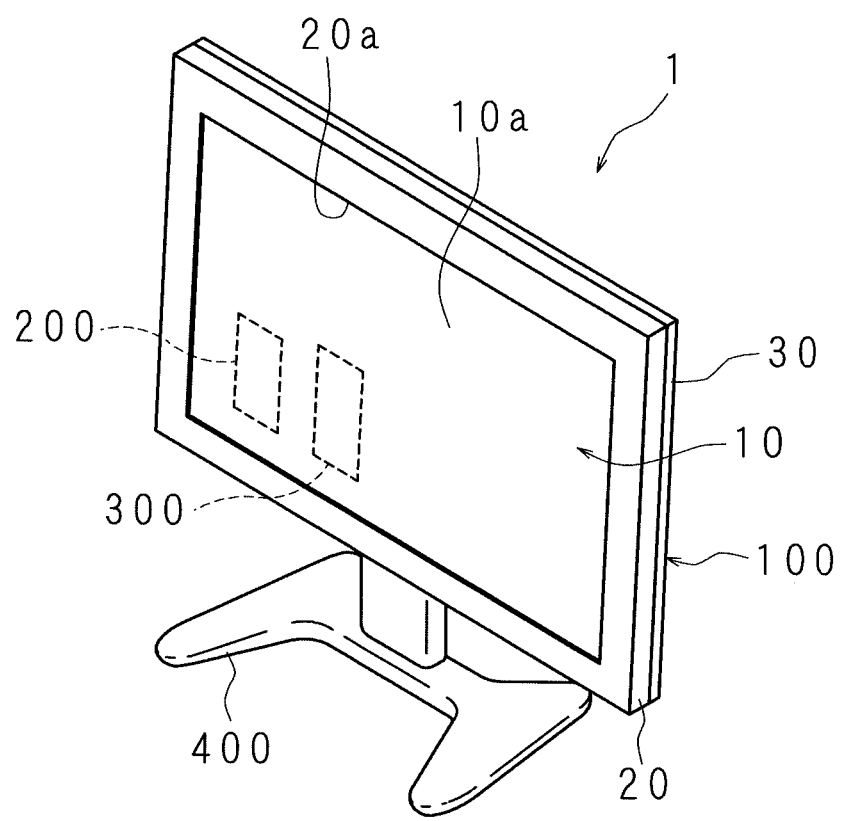
FIG. 1 is a perspective view illustrating an outer appearance of a television receiving apparatus according to Embodiment 1 of the present invention.
Figure 2:
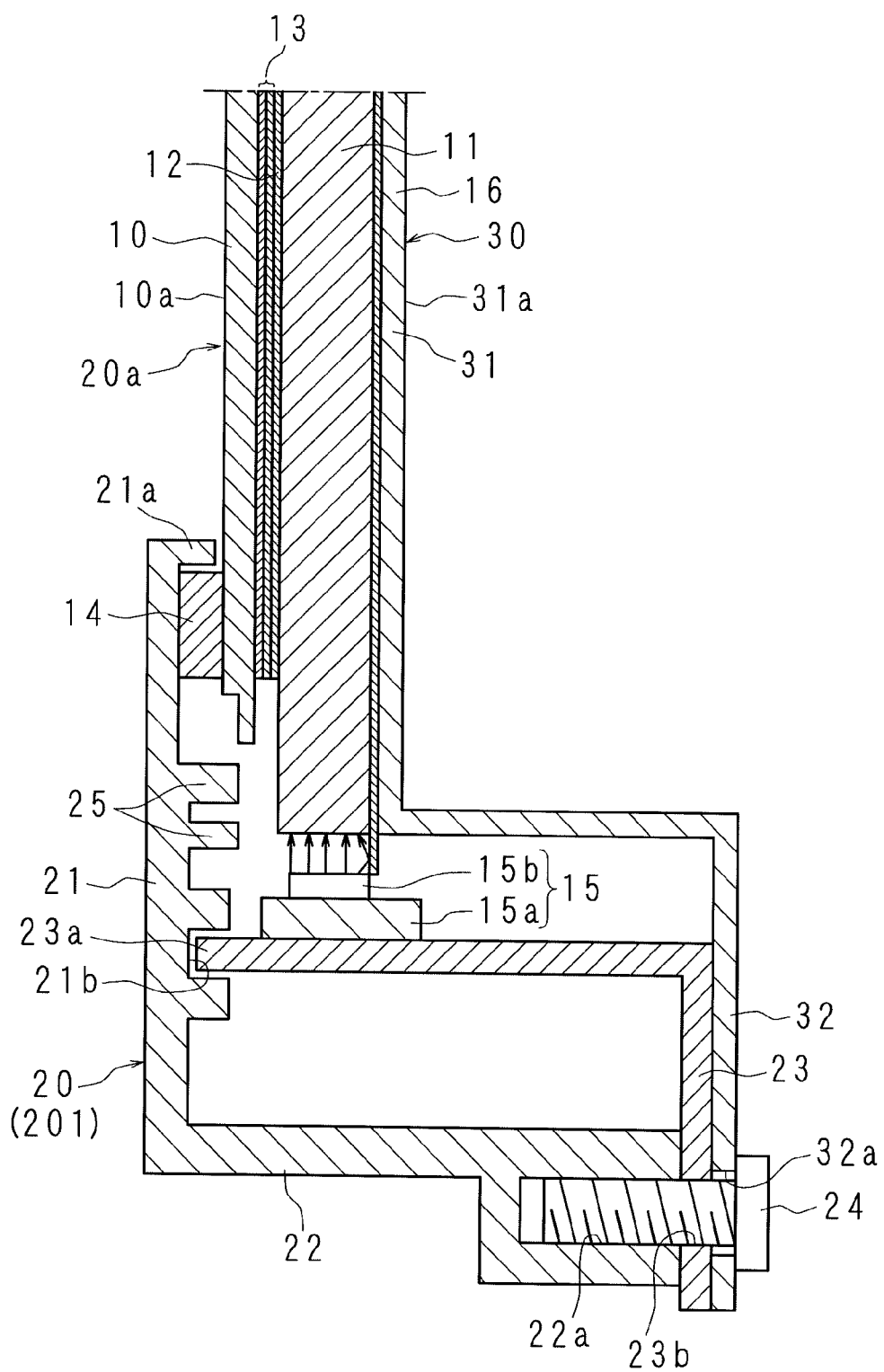
FIG. 2 is a partial cross-sectional view of a display apparatus according to Embodiment 1 of the present invention.

FIG. 1 is a perspective view illustrating an outer appearance of a television receiving apparatus (hereinafter, referred to as a "TV receiving apparatus") 1 according to Embodiment 1 of the present invention, and FIG. 2 is a partial cross-sectional view of a display apparatus 100 according to Embodiment 1 of the present invention.

The TV receiving apparatus 1 includes the display apparatus 100 that displays an image, a tuner 200 which is arranged in the display apparatus 100 to receive a broadcast wave from an antenna (not illustrated), and a decoder 300 that decodes an encoded broadcast wave. In the TV receiving apparatus 1, the broadcast wave received by the tuner 200 is decoded by the decoder 300 and an image is displayed on the display apparatus 100 based on the decoded information. A stand 400 for supporting the TV receiving apparatus 1 is disposed under the TV receiving apparatus 1.

The display apparatus 100 includes a laterally long rectangular liquid crystal display panel 10 having a display surface 10a on a front side thereof. The display panel 10 is housed longitudinally between a front cabinet 20 and a rear cabinet 30, which are disposed longitudinally in front and back. The front cabinet 20 is formed in a rectangular frame shape to cover peripheral edge parts of the display panel 10, and has a rectangular opening 20a in the center thereof. The front cabinet 20 is made of aluminum, for example. The rear cabinet 30 is formed in a rectangular tray shape with the front side open, and is made of an electro-galvanized steel plate. Further, the front cabinet 20 and the rear cabinet 30 may be made of a resin member as well.

The vertical and lateral dimensions of the front cabinet 20 and the rear cabinet 30 are substantially the same, and peripheral edge parts thereof face each other. The vertical and lateral dimensions of the display panel 10 are slightly larger than those of the opening 20a of the front cabinet 20, and the peripheral edge part of the display panel 10 faces an inner edge part of the front cabinet 20.

The front cabinet 20, which consists of the frame members having a substantially L-shaped cross-section, includes the opening 20a formed in the central portion, a front plate part 21 of rectangular frame shape exposed to the front, and a side plate part 22 extended from an outer edge part of the front plate part 21 (an edge part opposite to the opening 20a) to a rear side. The edge part 21a of the opening 20a of the front plate part 21 is bent to the rear side, and an elastic member 14 is disposed around the bent portion. The peripheral edge part of the display panel 10 faces the inner edge part of the front plate part 21 through the elastic member 14 so as to prevent damage to the display panel 10. The elastic member 14 is made of a resin member (for example, a high-density micro-urethane foam, rubber or latex), and is disposed continuously or intermittently along the edge part 21a.

A lock groove 22a which is hollowed to the front side is formed on the outer edge side of the side plate part 22 of the front cabinet 20 in order to lock the rear cabinet 30. The rear cabinet 30 has a plate-shaped concave part 31 protruding to the front side in the center part, and a plate-shaped peripheral edge part 32 extending to a peripheral rear end of the concave part 31. A through-hole 32a is formed in the peripheral edge part 32.

The side plate part is provided with a light source mounting part 23 made of a plate-shaped metal member with an L-shaped cross section. One side portion of letter L of the light source mounting part 23 is extended in a front-back direction, and a light source unit 15 is fixed on the inner surface side of the one side portion. The other side portion of letter L of the light source mounting part 23 is extended outwardly from the rear end portion of the one side portion of letter L. The light source unit 15 includes an elongated rectangular substrate 15, and a plurality of light emitting diodes (LEDs) 15b arranged on the substrate 15a in the longitudinal direction thereof. The substrate 15a is adhered to the light source mounting part 23 by double-sided tape with excellent heat conductivity and then screwed thereto.

A slot part 21b for locking the front end portion 23a of the light source mounting part 23 is formed on inner side of a front plate part 21, and a through-hole 23b is formed in the other side portion of the letter L shape. With the through-hole 23b overlapped on the through-hole 32a of the peripheral edge part 32 of the rear cabinet 30, a lock screw 24 is inserted into the through-holes 32a and 23b and screwed by tapping in the lock groove 22a, so that the front cabinet 20 and the rear cabinet 30 are coupled with the light source mounting part 23 sandwiched between the front and back.

A rectangular light guide plate 11 facing the display panel 10 is disposed on the rear side of the display panel 10. The vertical and lateral dimensions of the light guide plate 11 are slightly larger than those of the display panel 10. The horizontal position of the light guide plate 11 is substantially the same as the horizontal position of LED 15b, and a peripheral surface the light guide plate 11 is oppositely disposed adjacent to the LED 15b. A rectangular diffusion sheet 12 that uniformly diffuses light emitted from the front surface of the light guide plate 11, and a rectangular optical sheet 13 that collects light diffused by the diffusion sheet 12 toward the display panel 10 are sequentially disposed on the front surface of the light guide plate 11. The optical sheet 13 is disposed adjacent to a rear surface of the display panel 10. The vertical and lateral dimensions of the diffusion sheet 12 and the optical sheet 13 are smaller than those of the light guide plate 11.

A reflective sheet 16 that reflects incident light forwardly is disposed on a rear surface of the light guide plate 11. The vertical and lateral dimensions of the reflective sheet 16 are larger than those of the light guide plate 11. The light irradiated from LED 15b enters the peripheral surface of the light guide plate 11, and transmits and reflects on the inside the light guide plate 11 and the reflective sheet 16, and emits out from the front surface of the light guide plate 11. The emitted light transmits through the diffusion sheet 12 and the optical sheet 13 and reaches the display panel 10. The bottom part 31a of the concave part 31 of the rear cabinet 30 is located on the rear side of the reflective sheet 16, and the bottom part 31a is oppositely disposed in parallel adjacent to the reflective sheet 16.

Figure 3A:
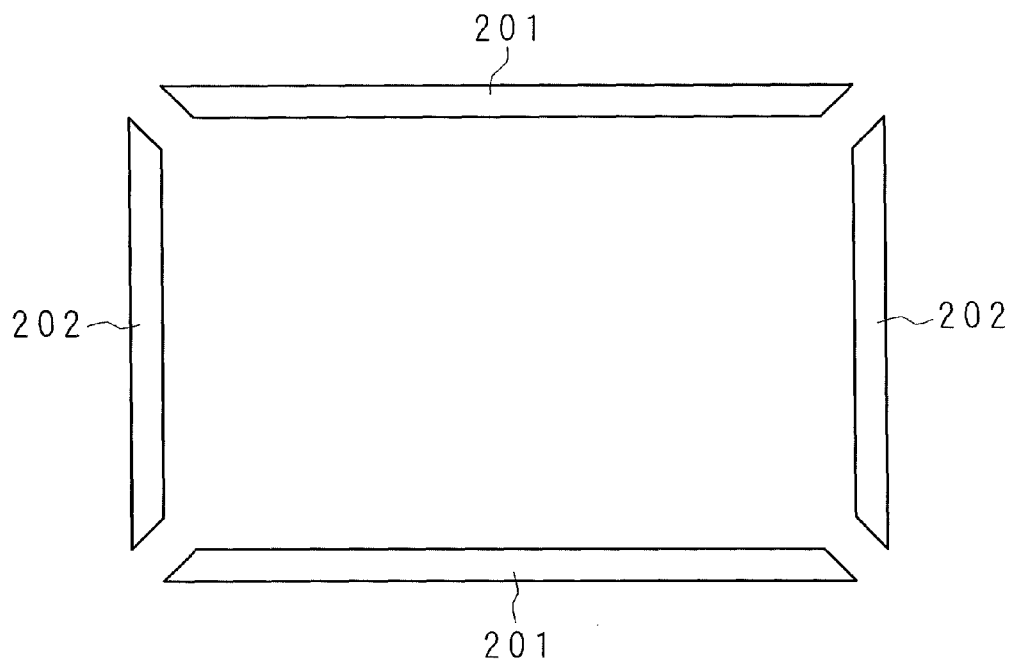
FIG. 3A is a front view schematically illustrating a general configuration of a front cabinet.
Figure 3B:
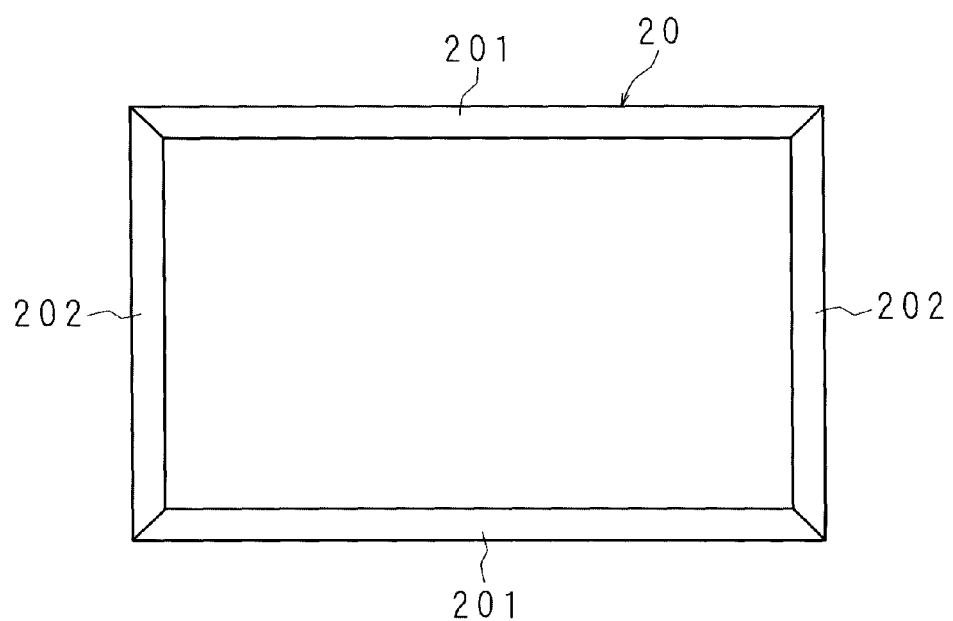
FIG. 3B is a front view schematically illustrating a general configuration of the front cabinet.

Next, the configuration of the front cabinet 20 will be described. FIGS. 3A and 3B are front views schematically illustrating a general configuration of the front cabinet.

The front cabinet 20 is divided into two lateral frames 201 forming the long sides of a rectangle and two vertical frames 202 forming short sides of the rectangle. The length of the vertical frame 202 is shorter than that of the lateral frame 201. The lateral frame 201 has a substantially L-shaped cross section as shown in FIG. 2. The vertical frame 202 also has a substantially L-shaped cross section, but is partly different from the lateral frame 201. The lateral and vertical frames 201 and 202 are made by extrusion molding, but may also be made by other methods such as drawing molding, injection molding and press molding.

Both end portions of the lateral and vertical frames 201 and 202 are inclined inversely with respect to the length direction at a substantially equal angle. The sum of the inclination angle of the end portion of the lateral frame 201 and the inclination angle of the end portion of the vertical frame 202 is about 90 degrees (for example, the inclination angle of the both frames is 45 degrees). The display apparatus includes a connector 40 that connects the end portions of the adjacent lateral and vertical frames 201 and 202 in an abutted state at the four corners of the rectangle, by oppositely disposing two lateral frames 201 so as to be parallel with each other while the inclined ends thereof facing inwardly, and oppositely disposing two vertical frames 202 so as to be positioned orthogonal to the lateral frame 201 and parallel with each other while the inclined ends thereof facing inwardly.

Figure 4:
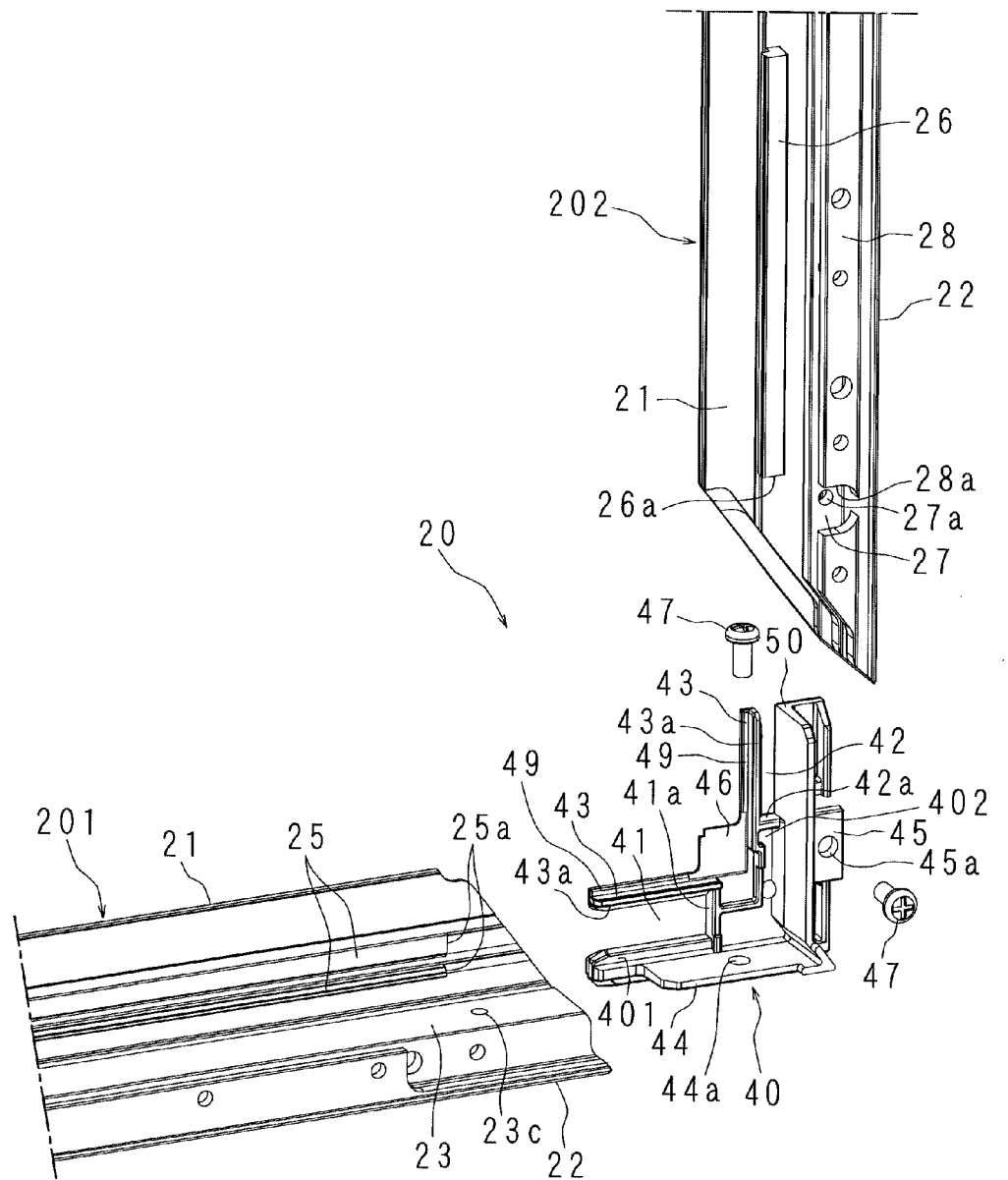
FIG. 4 is an exploded perspective view of some members of the display apparatus shown in FIG. 2.
Figure 7:
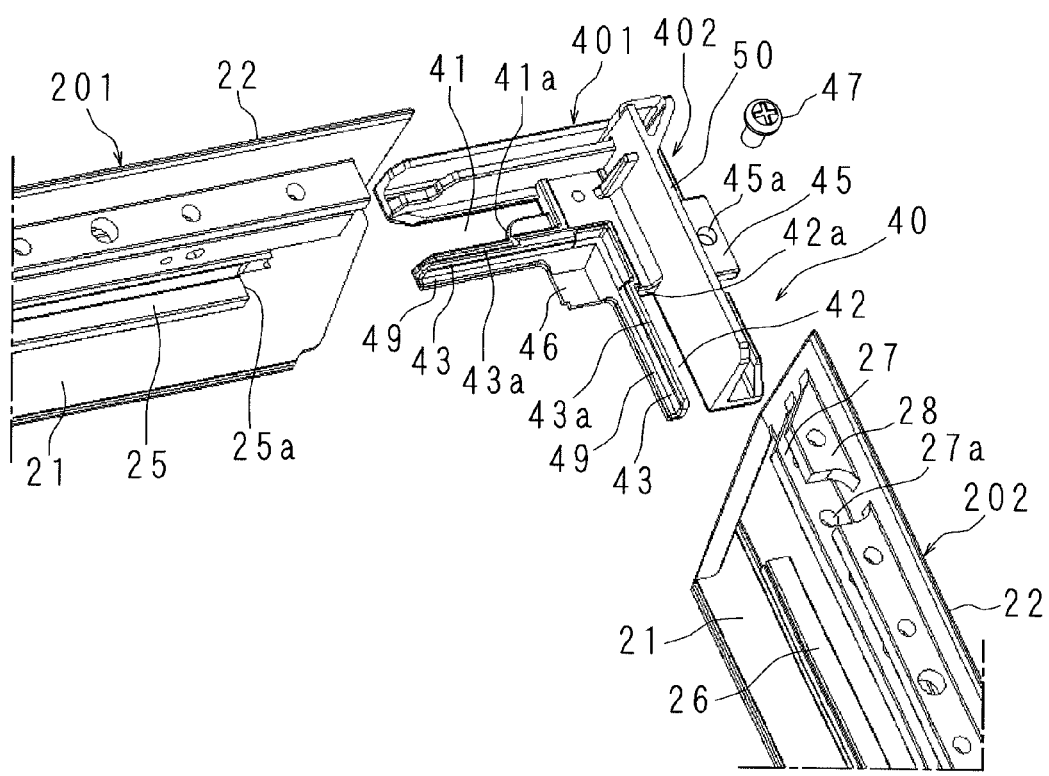
FIG. 7 is an exploded perspective view illustrating an outer appearance of some other members of the display apparatus shown in FIG. 2.
Figure 8:
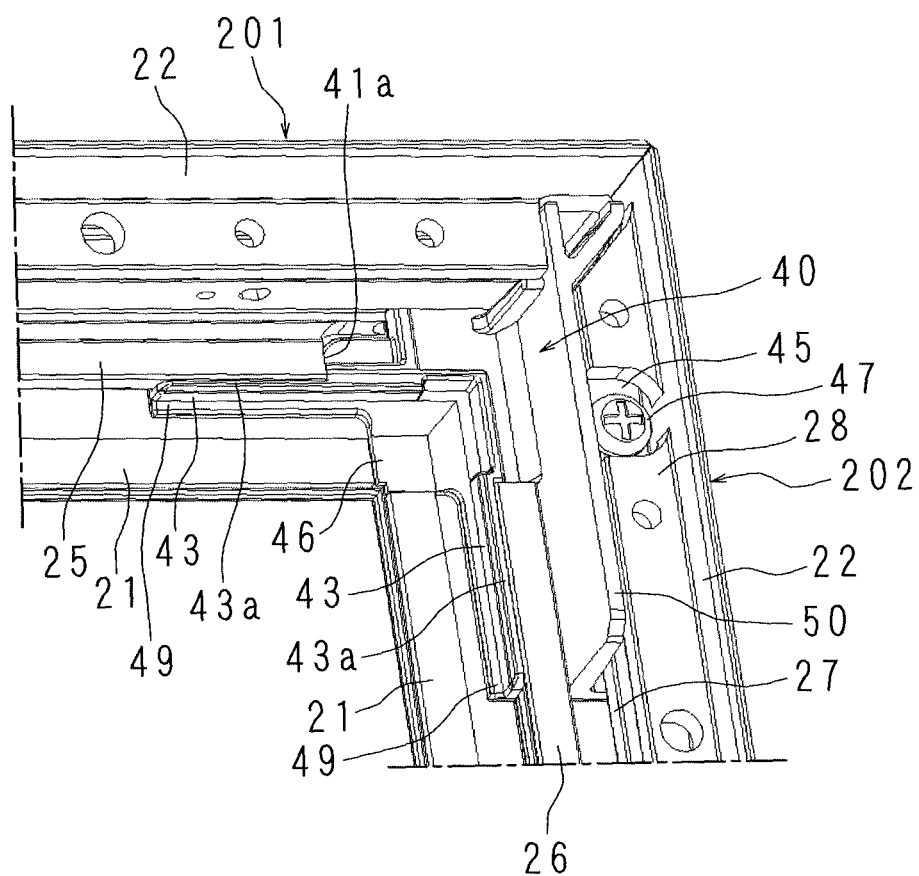
FIG. 8 is a perspective view illustrating an assembled state of the members shown in FIG. 7.
Figure 9:
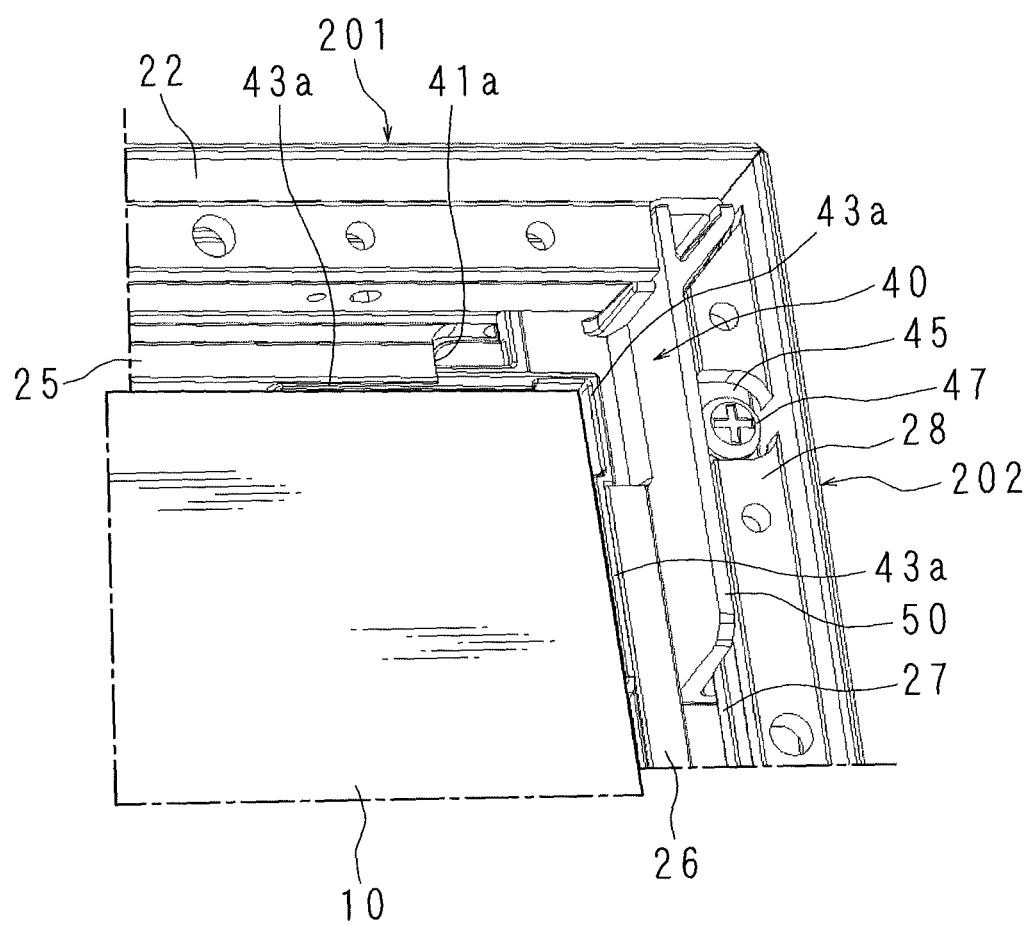
FIG. 9 is a perspective view illustrating an assembled state of a display panel on a frame.
Figure 10:
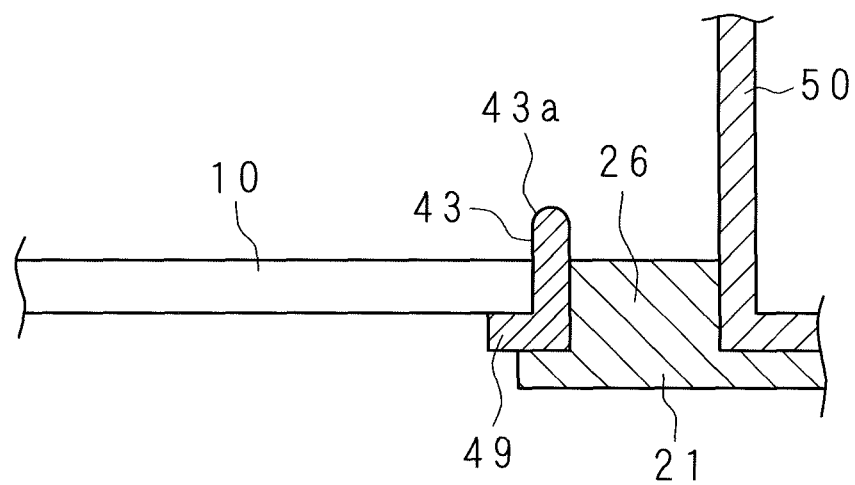
FIG. 10 is a cross-sectional view illustrating the assembled state of the display panel on the frame.

Next, the configuration in which the lateral and vertical frame 201 and 202 are connected by the connector 40 will be described. FIG. 4 is an exploded perspective view of some members of the display apparatus shown in FIG. 2, FIG. 5 is a perspective view illustrating an assembled state of the display apparatus shown in FIG. 4, FIG. 6 is a front perspective view illustrating an outer appearance of a part of the display apparatus shown in FIG. 5, FIG. 7 is an exploded perspective view illustrating an outer appearance of some other members of the display apparatus shown in FIG. 2, FIG. 8 is a perspective view illustrating an assembled state of the members shown in FIG. 7, FIG. 9 is a perspective view illustrating an assembled state of a display panel on a frame, and FIG. 10 is a cross-sectional view illustrating the assembled state of the display panel on the frame. Moreover, FIGS. 4 to 6 show the connection configuration at the front lower left corner, and FIGS. 7 to 9 show the connection configuration at the front upper left corner. Further, the member disposed at the front right lower corner has a bilateral symmetry with the member disposed at the front left lower corner, and the member disposed at the front right upper corner has a bilateral symmetry with the member disposed at the front right lower corner.

The connector 40 has a lateral plate part 401 coupled to the lateral frame 201 and a vertical plate part 402 coupled to the vertical frame 202, and is formed in a substantially L shape by the lateral plate part 401 and the vertical plate part 402 as seen in the front-back direction. A notch 41 cut out in a concave shape inward from the end edge of the plate part in the longitudinal direction of the vertical frame 201 is formed in the lateral plate part 401. A notch 42 cut out in a concave shape inward from the end edge of the plate part in the longitudinal direction of the vertical frame 202 is formed in the vertical plate part 402.

A protrusion part 25 is formed in the lateral frame 201 to be fitted to the notch 41 on the longitudinal direction of the lateral frame 201. Similarly, a protrusion part 26 is formed on the vertical frame 202 to be fitted to the notch 42 in the vertical direction of the vertical frame 202.

The L-shaped connector 40 has an edge plate part 49 formed on the inner edge side thereof so as to be located on the front side of the peripheral edge part of the display panel 10. A laterally long-shaped protrusion part 43 protruding rearward is formed on the edge plate part 49 inward from the notch 41 of the lateral plate part 401. The rear end portion of the protrusion part 43 is a chamfered part 43a. A laterally long-shaped protrusion part 43 protruding rearward is formed on the edge plate part 49 inward from the notch 42 of the vertical plate part 402. The rear end portion of the protrusion part 43 is a chamfered part 43a.

A lateral plate-shaped protrusion piece 44 protruding rearward is disposed on the outward portion from the notch 41 of the lateral plate part 401. A vertical through-hole 44a is formed in the protrusion piece 44. Moreover, the light source mounting part 23 is in contact with the outer surface of the protrusion piece 44, and has a screw hole 23c formed at the position corresponding to the position of the through-hole 44a.

The vertical plate part 402 includes a plate part 50 which protrudes rearward at an outer portion from the notch 42 and a plate-shaped protrusion piece 45 which is formed on the outer surface of the plate part 50 and has a vertical plate surface. A through-hole 45a is formed in the protrusion piece 45.

Two plate parts 27 and 28, which face each other in the front-back direction at an interval slightly wider than the plate thickness of the plate-shaped protrusion piece 45, are disposed in the vertical frame 202. The rear plate part 28 has a punched part 28a in which a part thereof is punched, and the front plate part 27 has a screw hole 27a formed at the position corresponding to the punched part 28a.

A protrusion part 25 is fitted to the notch 41 and the front end portion 25a of the protrusion part 25 abuts the base portion 41a of the notch 41, so that the lateral frame 201 and the connector 40 are positioned in the longitudinal direction of the lateral frame 201. Then, in a state positioned like this, a screw 47 passes through the through-hole 44a of the protrusion piece 44 to be screwed in the screw hole 23c of the light source mounting part 23, so that the connector 40 and the lateral frame 201 are coupled.

Similarly, the front end portion 26a of the protrusion part 26 abuts the base portion 42a of the notch 42, so that the vertical frame 202 and the connector 40 are positioned in the longitudinal direction of the vertical frame 202. Then, in a state positioned like this, the screw 47 passes through the punched part 28a of the plate part 28 and the through-hole 45a of the protrusion piece 45 to be screwed in the screw hole 27a of the plate part 27, so that the connector 40 and the vertical frame 202 are coupled.

A rectangular plate-shaped shield part 46, which is connected to the edge plate part 49 and has the same plane direction with the edge plate part 49, is extended inwardly from the inner corner of the L-shaped connector 40.

As described above, the front cabinet 20, which is formed by aligning and combining two lateral and vertical frames 201 and 202 with four connectors 40, is placed such that the front side thereof is downward. In addition, as the display surface 10a of the display panel 10 is placed facing downward, and the end portion of the display panel 10 is guided by the chamfered part 43a of the protrusion part 43, it is possible to arrange in such a way that the end face of the display panel 10 faces the side surface (plane) of the protrusion part 43 of the front cabinet 20, and the edge plate part 49 is positioned on the front side of the peripheral edge part of the display panel 10. Thereafter, the optical sheet 13, the diffusion sheet 12, the light guide plate 11 and the reflective sheet 16 are overlapped on the rear surface of the display panel 10 in sequence, and further, the rear cabinet 30 is screwed on the front cabinet 20 in an overlapped state of the rear cabinet 30, so as to make a display apparatus 100.

According to the present embodiment, in a case of connecting the adjacent lateral frame 201 and the vertical frame 202 by means of the connector 40, when the front end portion 25a of the lateral frame 201 and the front end portion 26a of the vertical frame 202 abut each of the positioning parts 41a and 42a of the connector 40, and the lateral and vertical frame 201 and 202 are positioned in the respective longitudinal directions thereof, the lateral and vertical frames 201 and 202 are coupled to the connector 40, so that it is possible to couple these frames with the connector at sufficient strength with an increased positioning accuracy therebetween.

EMBODIMENT 2

A TV receiving apparatus according to Embodiment 2 of the present invention has a different configuration of a connector 410 for connecting the lateral and vertical frames 201 and 202 of the display apparatus, compared to the configuration of the connector 40 according to Embodiment 1.

Figure 11:
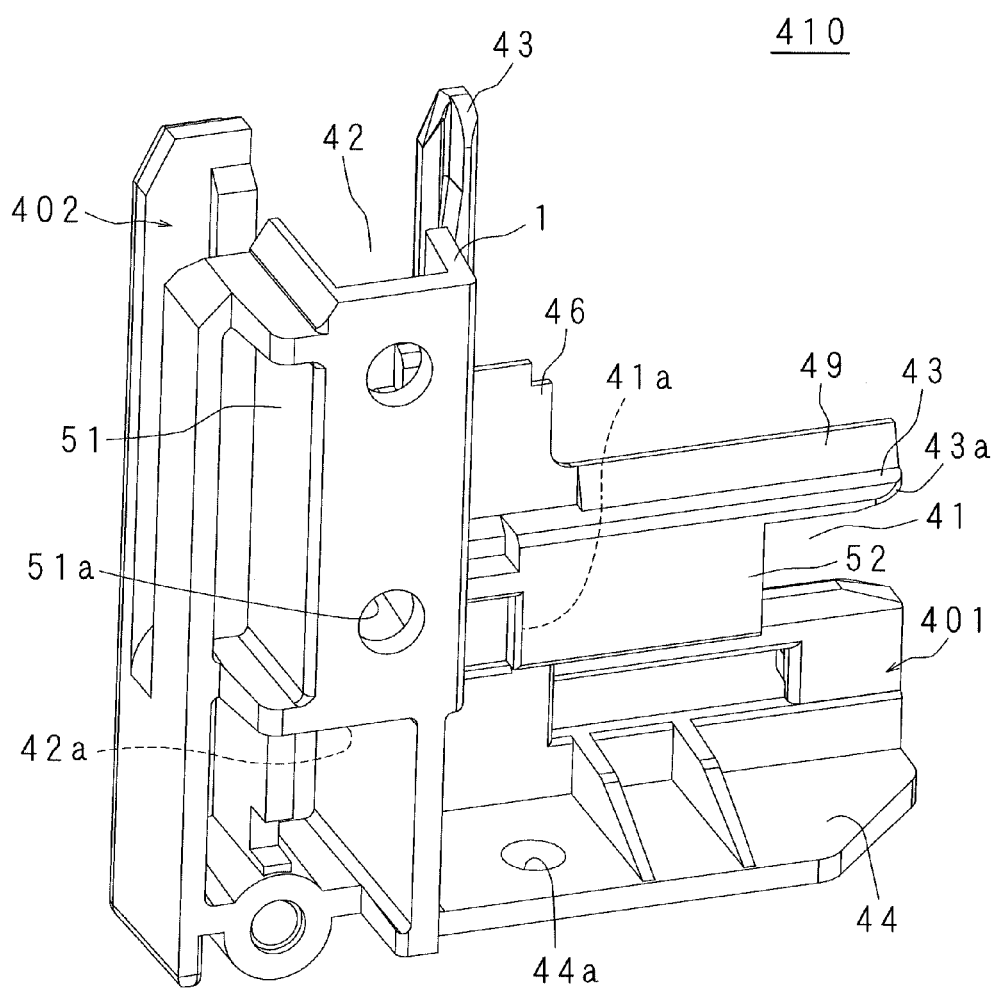
FIG. 11 is a perspective view illustrating a connector according to Embodiment 2 of the present invention.

FIG. 11 is a perspective view illustrating the connector 410. In the drawing, the same parts as in the connector 40 of FIG. 4 will be denoted by the same reference numerals, and a detailed description thereof will be omitted.

The connector 410 is provided with a front end covering part 52 disposed below a protrusion part 43 of a lateral plate part 401 so as to cover the upper rear side of the front end portion 25a of the protrusion part 25 of the lateral frame 201. In addition, a vertical plate part 402 is provided with a base portion 42a abutting the front end portion 26a of the protrusion part 26 of the vertical frame 202 and a protrusion part insertion part 51 covering the lateral both sides and rear side of the protrusion part 26. The protrusion part insertion part 51 is formed in a substantially U shape as seen from the plane cross section. Two screw insertion holes 51a are formed in the vertical plate part of the protrusion part insertion part 51.

Also in the display apparatus according to the present embodiment, similarly to the display apparatus 100 according to Embodiment 1, two lateral and vertical frames 201 and 202 are aligned and coupled with four connectors 410, and the coupled front cabinet 20 is placed such that the front side thereof is downward. In addition, as the display surface 10a of the display panel 10 is placed in facing downward, and the end portion of the display panel 10 is guided by the chamfered part 43a of the protrusion part 43, it is possible to arrange in such a way that the side surface of the display panel 10 faces the side surface of the protrusion part 43 of the front cabinet 20, and the edge plate part 49 is positioned on the front side of the peripheral part of the display panel 10. After the display panel 10 is arranged as described above, the optical sheet 13 is disposed on the rear side of the display panel 10.

Figure 12:
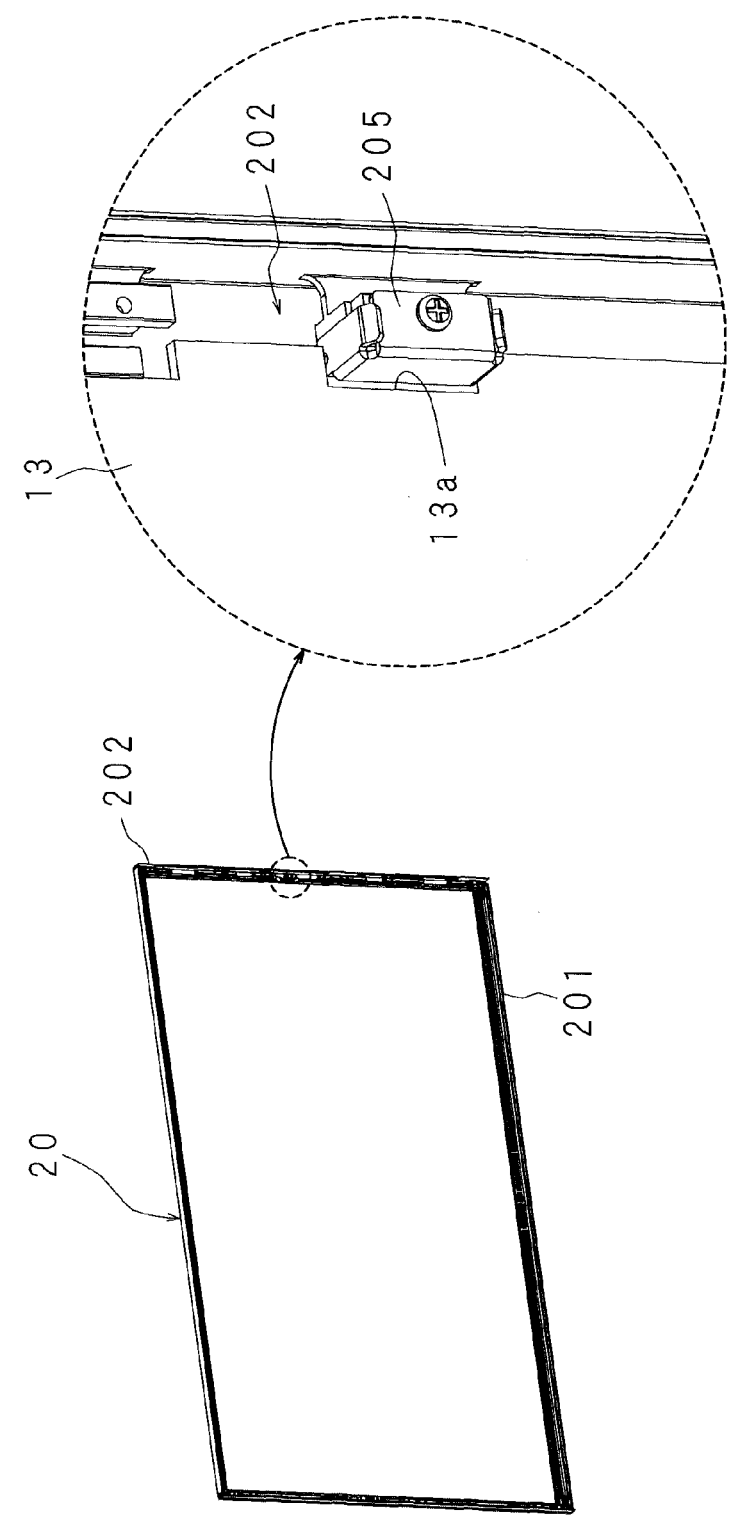
FIG. 12 is a perspective view illustrating a front cabinet on which the display panel and an optical sheet are disposed.
Figure 13:
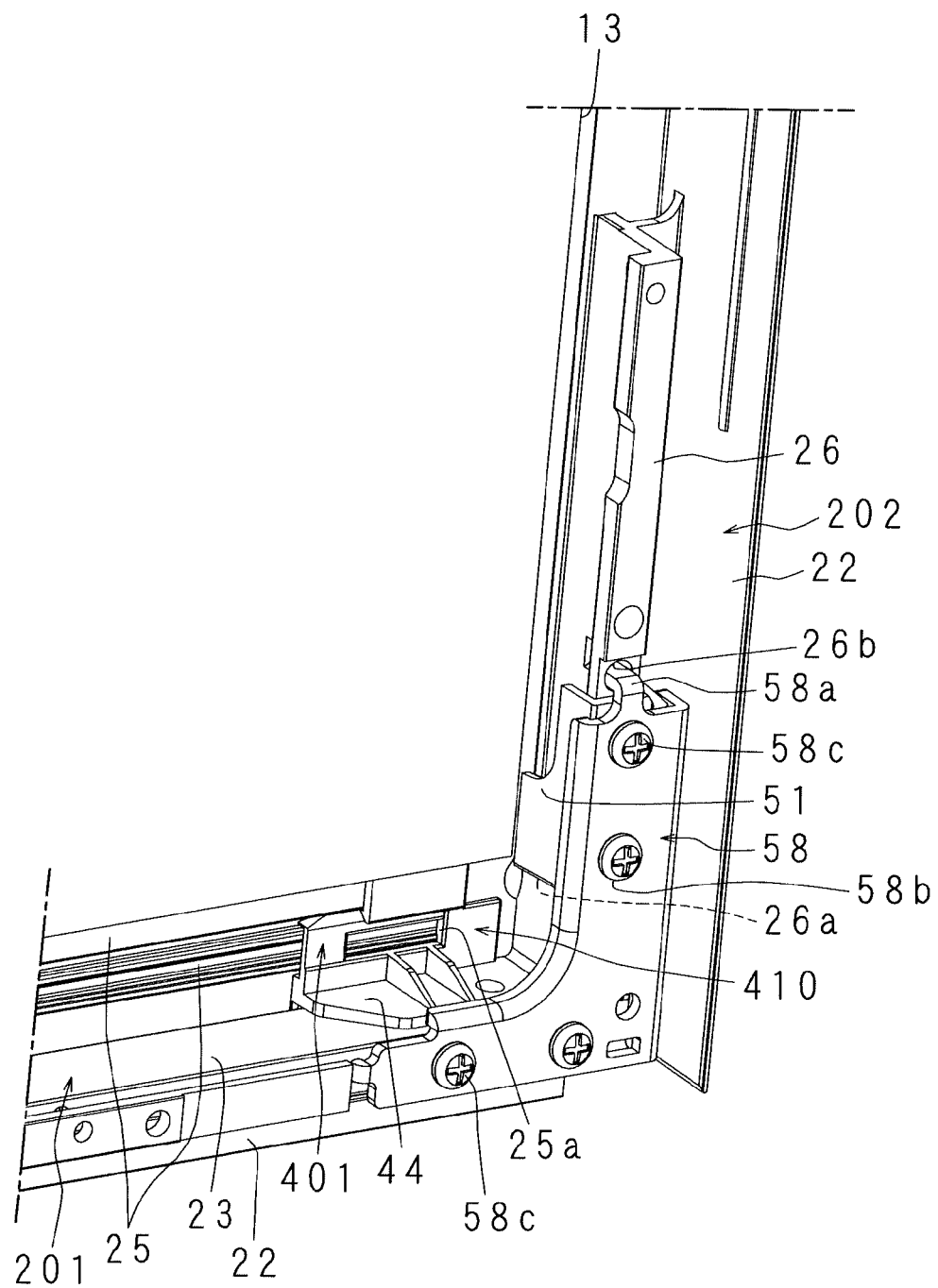
FIG. 13 is a perspective view of a part of FIG. 12.

FIG. 12 is a perspective view illustrating the front cabinet 20 on which the display panel 10 and the optical sheet 12 are disposed, and FIG. 13 is a perspective view of a part of FIG. 12. In FIG. 13, the same parts as in the parts of FIG. 4 will be denoted by the same reference numerals, and a detailed description thereof will be omitted. In FIGS. 12 and 13, the display panel 10 is located on the front side of an optical sheet 13.

An angle 205 in which the optical sheet 13 is inserted is disposed in a substantially central portion of each vertical frame 202. The concave part 13a is formed in the central portion of both short sides of the optical sheet 13. Herein, the concave part 13a is fitted to the angle 205.

As shown in FIG. 13, the protrusion part 26 of the vertical frame 202 of the present embodiment is different in shape from the protrusion part 26 according to Embodiment 1, and has a curved part which is formed in an L shape in the front-back direction as seen from the plane cross section and curved convexly rearward on a front end portion thereof. The protrusion part 26 has a through-hole 26b formed on the end side so as to pass through in the front-back direction. A plurality of screw holes (not illustrated) are formed in a rear vertical plate portion of the light source mounting part 23 of the lateral frame 201. A connector cover 58, which is formed in a substantial L shape as seen from the side surface and covers the rear portion of the connector 410, has a lock part 58a formed in the front end portion to be locked into the through-hole 26b, and a plurality of screw insertion holes 58b arranged in the L shape on the main body part thereof. The lock part 58a is locked into the through-hole 26b, and the screws 58c are inserted into the screw insertion holes 58b and the screw insertion holes 51a of the protrusion part insertion part 51 to be locked into the protrusion part 26, and then the screws 58c are inserted into the screw insertion holes 58b facing the light source mounting part 23 to be screwed in the screw holes of the light source mounting part 23, so that the connector cover 58 is mounted on the connector 410. The display panel 10 is supported by the protrusion part 43, and the optical sheet 13 is disposed outside of the display panel 10, with the central portions of both short sides locked to respective angles 205.

EMBODIMENT 3

Figure 14:
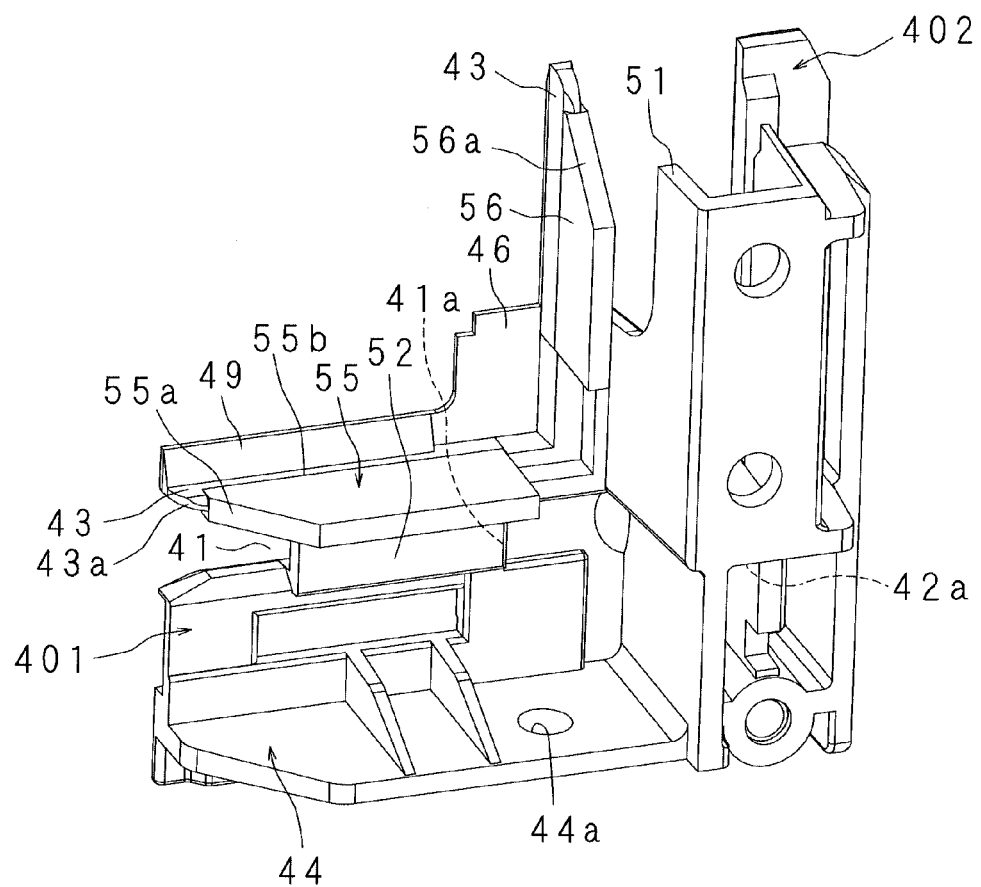
FIG. 14 is a perspective view illustrating a connector according to Embodiment 3 of the present invention.

A TV receiving apparatus according to Embodiment 3 of the present invention does not include the angle 205 in the vertical frame 203 of the display apparatus, and has a different configuration of a connector 411, compared to the configuration of the connector 40 according to Embodiment 1 and the connector 410 according to Embodiment 2. FIG. 14 is a perspective view illustrating a connector 411 according to Embodiment 3 of the present invention. In the drawing, the same parts as in the connectors 410 of FIG. 11 will be denoted by the same reference numerals, and a detailed description thereof will be omitted.

The connector 411 includes a first support part 55 which is connected in a flat plate shape on the protrusion part 43 of a lateral plate part 401, and a second support part 56 which is connected in a flat plate shape on the protrusion part 43 of a vertical plate part 402. The first and second support parts 55 and 56 have notches 55a and 56a cut out obliquely on the end portion of the display unit central side in the longitudinal direction. The first support part 55 is formed on the protrusion part 43 such that a plane thereof protrudes from the side surface (plane) of the protrusion part 43, and a guide part 55b for guiding the display panel 10 between the edge plate part 49 and a front end surface thereof is formed. Corner portions of two or three optical sheets 13 are positioned to be supported by the first and second support parts 55 and 56.

Also in the display apparatus according to the present embodiment, similarly to the display apparatus according to Embodiments 1 and 2, two lateral and vertical frames 201 and 202 are aligned and coupled with four connectors 411, and the coupled front cabinet 20 is placed such that the front side thereof downward. In addition, as the display surface 10a of the display panel 10 is placed in facing downward, and the end portion of the display panel 10 is guided by the chamfered part 43a of the protrusion part 43 and the guide part 55b of the first support part 55, it is possible to arrange in such a way that the side surface of the display panel 10 faces the side surface of the protrusion part 43 of the front cabinet 20, and the edge plate part 49 is positioned on the front side of the peripheral part of the display panel 10.

After the display panel 10 is arranged as described above, the optical sheet 13 is supported on the rear side of the display panel 10 while aligning the corners thereof by the first and second supports 55 and 56.

Figure 15:
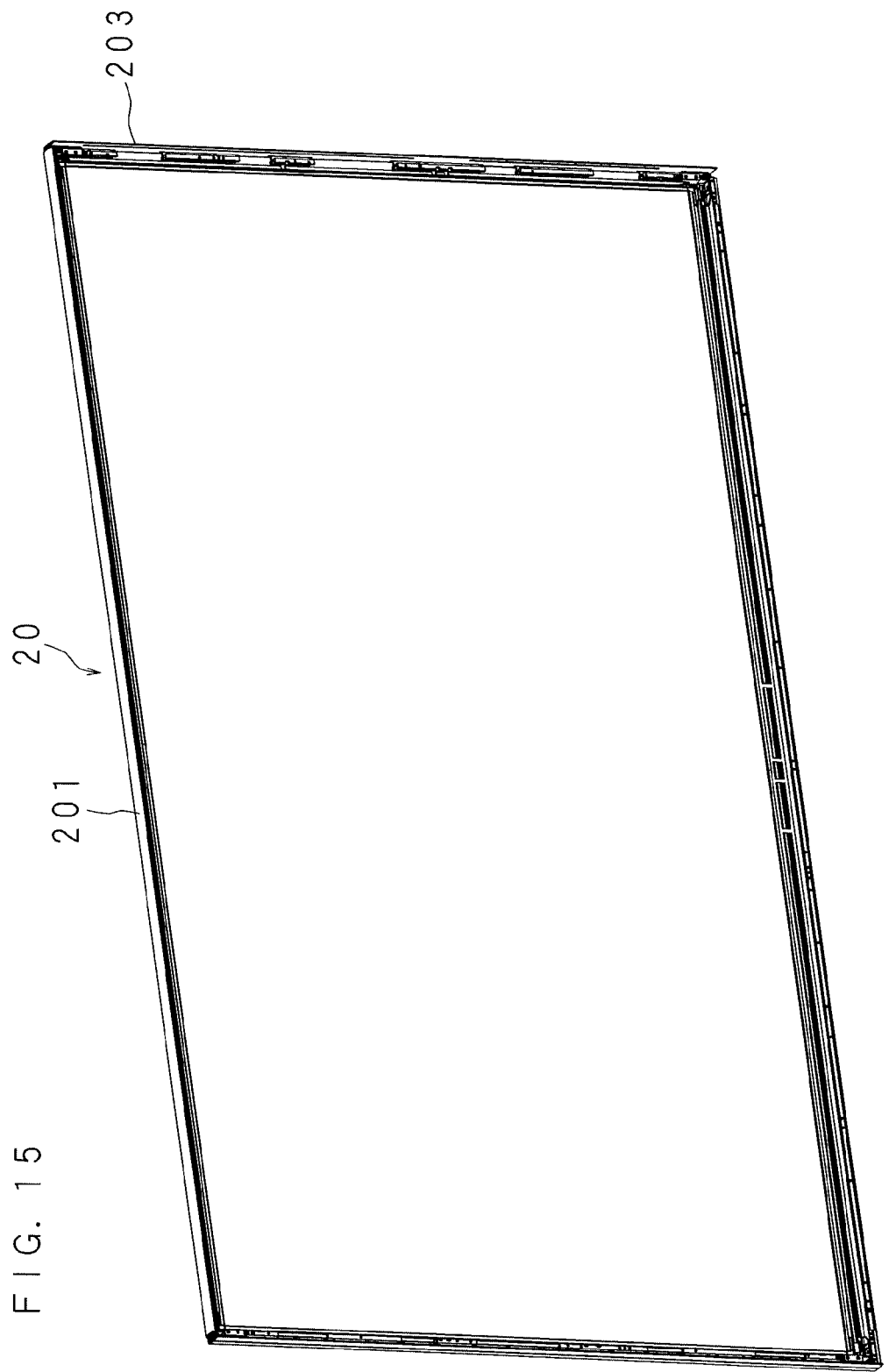
FIG. 15 is a perspective view illustrating a state in which a horizontal frame and a vertical frame are connected with the connector.
Figure 16:
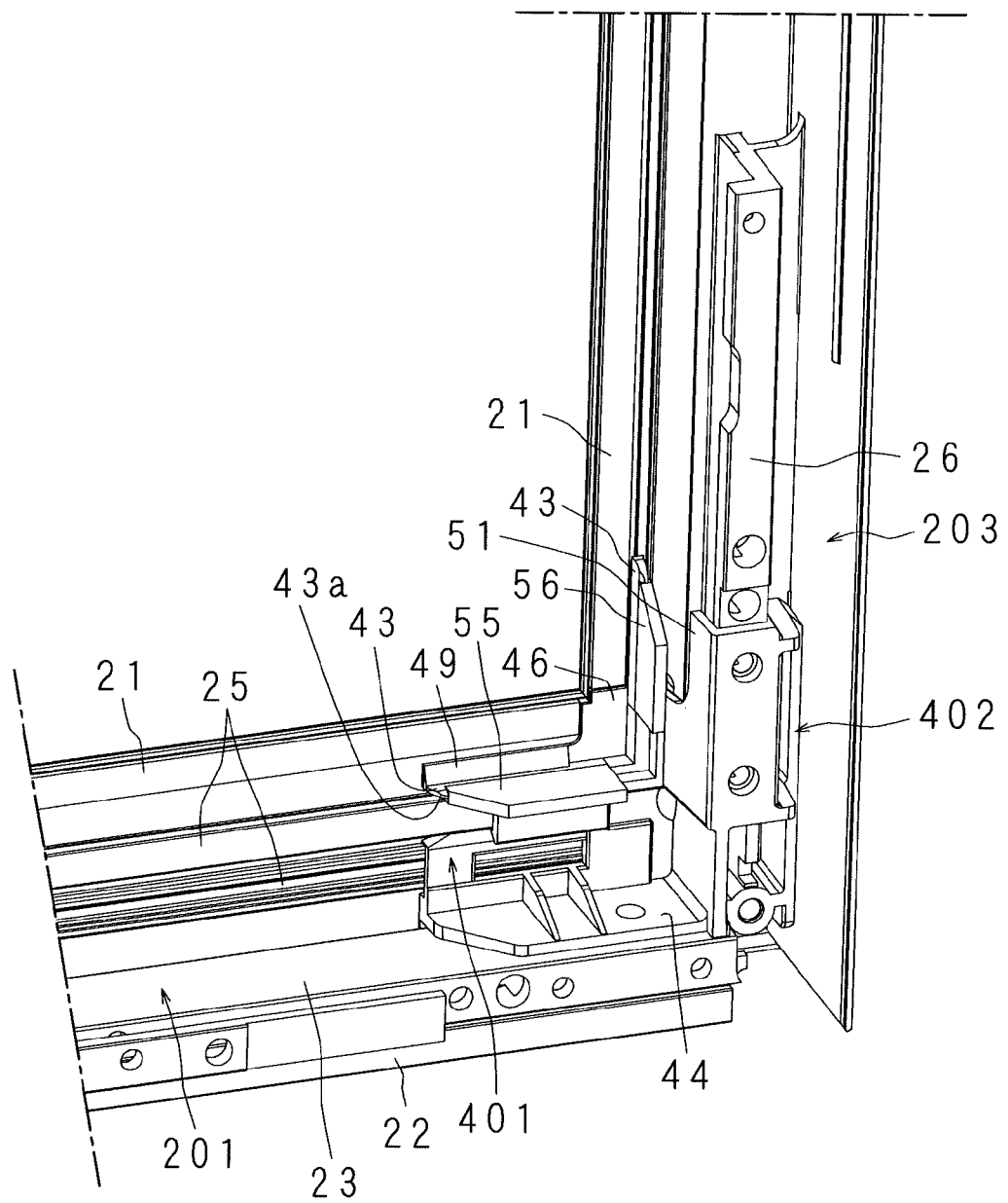
FIG. 16 is a perspective view of a part of FIG. 15.
Figure 17:
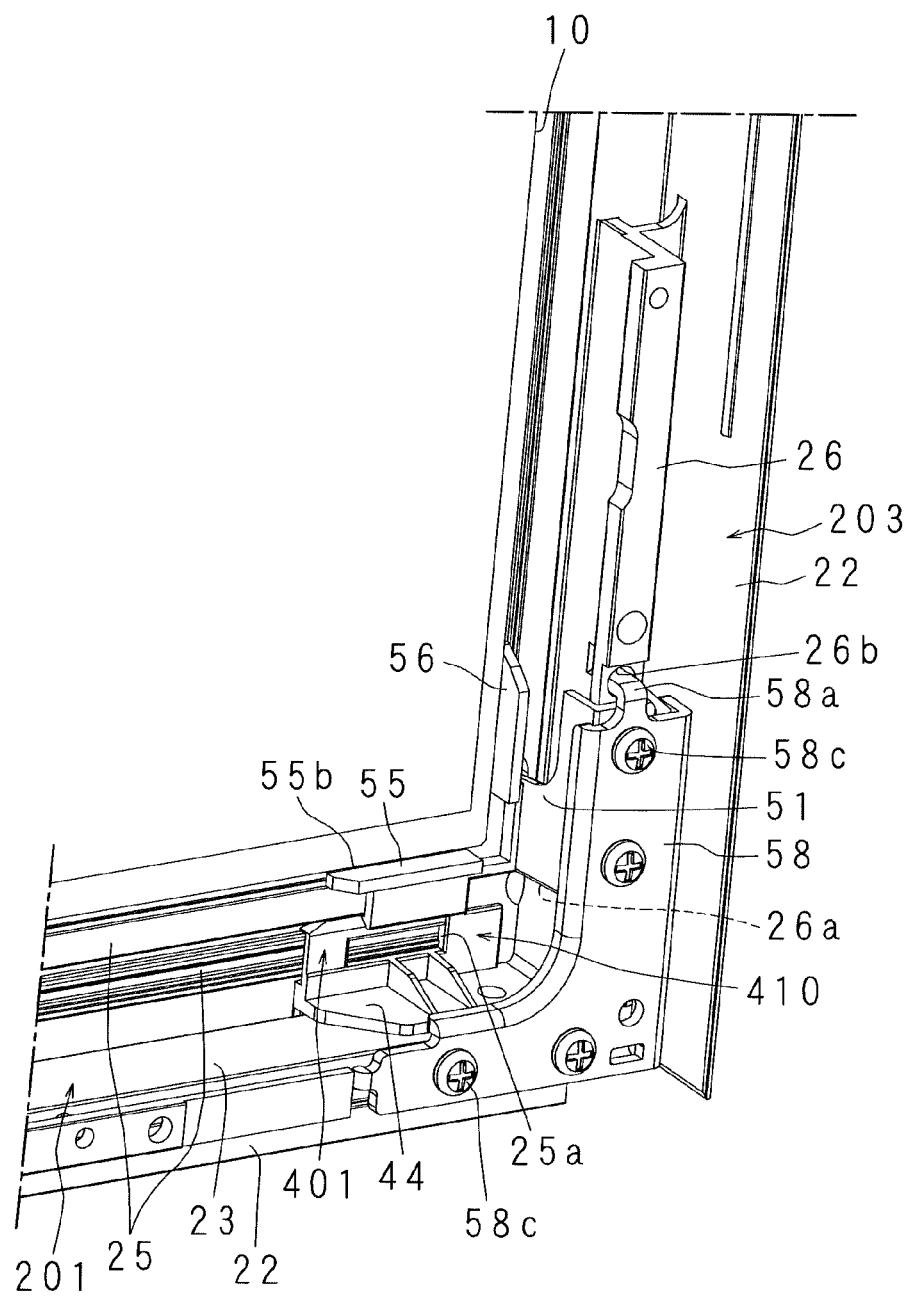
FIG. 17 is a perspective view illustrating a state in which the display panel is supported by the connector.
Figure 18:
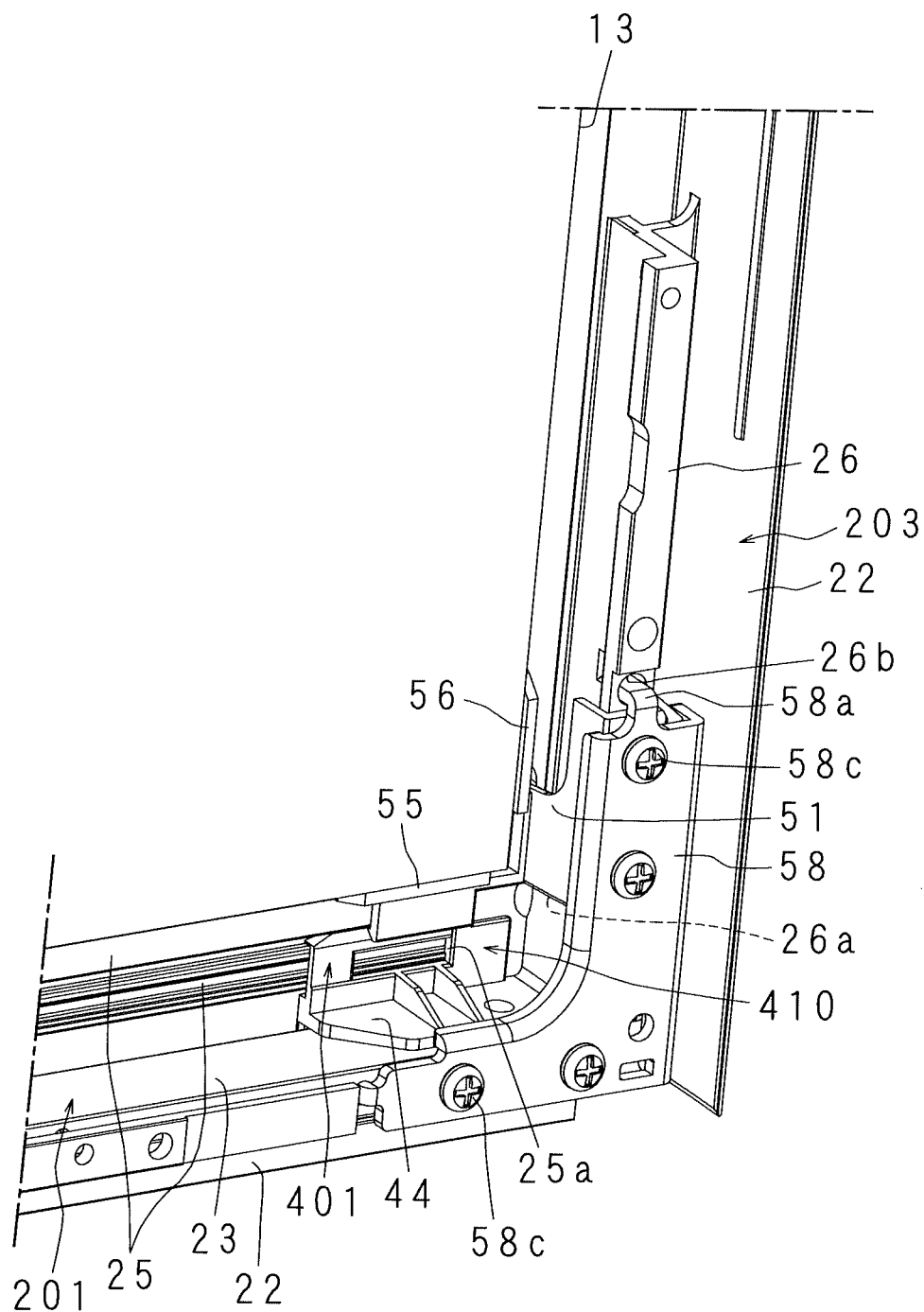
FIG. 18 is a perspective view illustrating a state in which the optical sheet is supported by the connector.

FIG. 15 is a perspective view illustrating a state in which the horizontal and vertical frames 201 and 203 with the connector 411 are connected, FIG. 16 is a perspective view of a part of FIG. 15, FIG. 17 is a perspective view illustrating a state in which the display panel 10 is supported by the connector 411, and FIG. 18 is a perspective view illustrating a state in which the optical sheet 13 is supported by the connector 411. In the drawings, the same parts as in the parts of FIGS. 12 and 13 will be denoted by the same reference numerals, and a detailed description thereof will be omitted.

In the present embodiment, the display panel 10 is guided by the guide part 55b to be securely supported by the protrusion parts 43 and 43, and the optical sheet 13 is guided by the notches 55a and 56a of the first and second support parts 55 and 56 to be securely supported by the first and second support parts 55 and 56.

In addition, in the present embodiment, since the optical sheet 13 is supported by the first and second support parts 55 and 56, it is not necessary to form the concave part 13a in the optical sheet 13 and dispose the angle 205 in the vertical frame 203. Therefore, the component costs may be reduced, and since a process of forming the concave part 13a is not required and the optical sheet 13 is easily mounted on the display unit, the production costs may be reduced.

EMBODIMENT 4

A TV receiving apparatus according to Embodiment 4 of the present invention has a different configuration of an optical sheet 131, compared to the configuration of the optical sheet 13 according to Embodiment 3.

Figure 19:
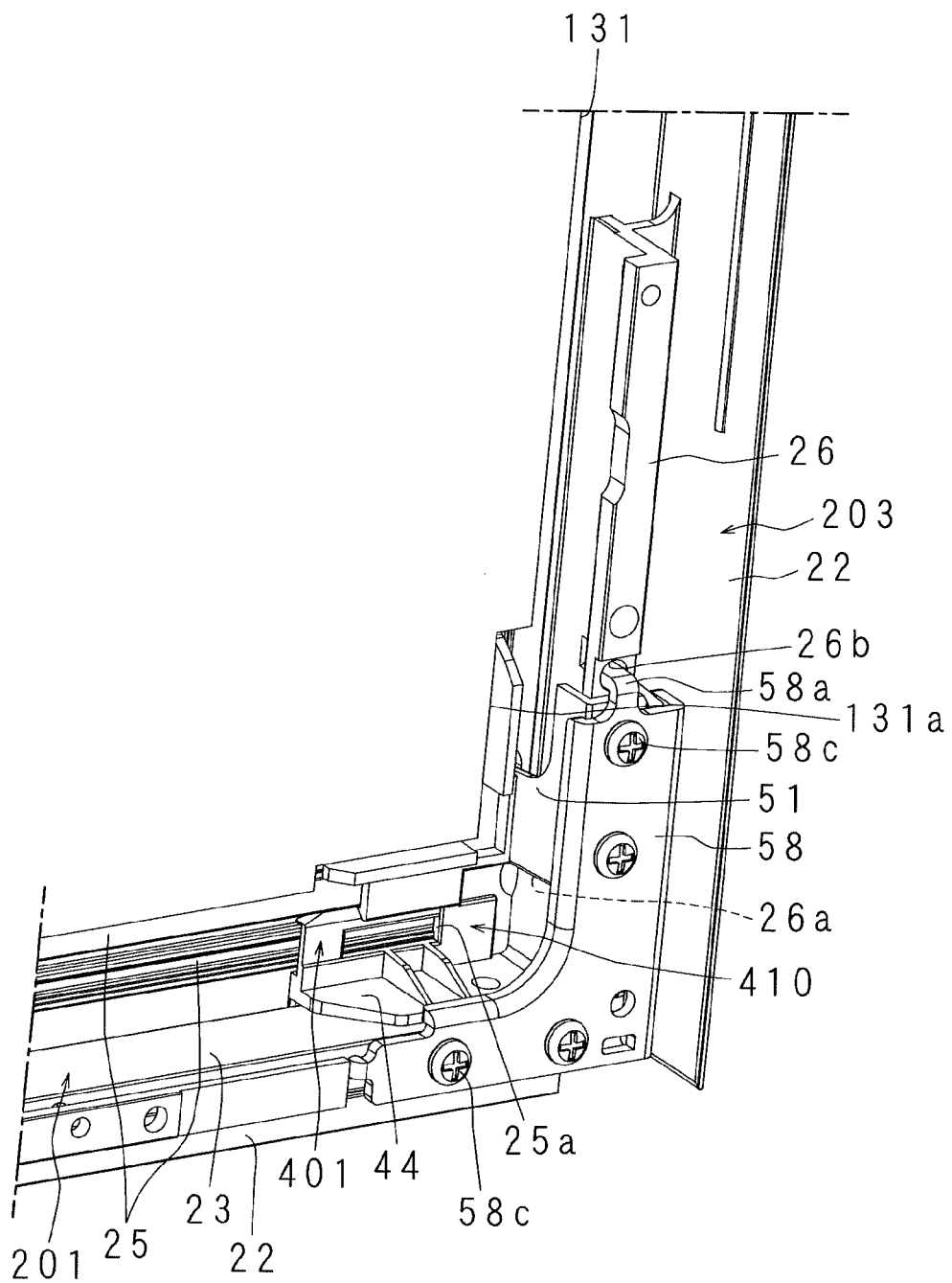
FIG. 19 is a perspective view illustrating a front cabinet, a display panel, and an optical sheet according to Embodiment 4 of the present invention.

FIG. 19 is a perspective view illustrating a front cabinet 20, a display panel 10, and an optical sheet 131 according to Embodiment 4 of the present invention. In the drawing, the same parts as in the parts of FIG. 18 will be denoted by the same reference numerals, and a detailed description thereof will be omitted. In FIG. 19, the display panel 10 is located on the front of the optical sheet 131.

An optical sheet 131 according to the present embodiment is provided with notches 131a formed in a substantial L shape at each of four corner portions. In the present embodiment, since the notches 131a are fitted to the first and second support parts 55 and 56, the optical sheet 131 is fixed more securely within the display unit.

As this description may be embodied in several forms without departing from the spirit of essential characteristics thereof, the present embodiment is therefore illustrative and not restrictive, since the scope is defined by the appended claims rather than by the description preceding them, and all changes that fall within metes and bounds of the claims, or equivalence of such metes and bounds thereof are therefore intended to be embraced by the claims.

The invention claimed is:

1. A display apparatus including a display unit, and a rectangular frame which covers peripheral parts of the display unit, wherein the frame has four frame members which form respective sides of a rectangle, and four connectors which connect adjacent end portions of the four frame members,
wherein the connector comprises:
two plate parts which elongate respectively in the respective longitudinal directions of the respective frame members to be connected; and
two positioning parts which are formed respectively by respective notches, which are recessed in a concave shape inward from the end edges of the plate parts, and abut against the frame members to be connected so as to position the frame members in the respective longitudinal directions,
the frame member comprises:
a part to be positioned which is formed by a protrusion part, which protrudes to be fitted to the notch and abuts against a base portion of the notch, and abuts against the positioning part, and
the display apparatus comprises a coupling portion which couples the frame member and the connector together.

2. The display apparatus according to claim 1, wherein the display unit has a display surface on a front side thereof, and
the connector includes a second positioning part configured to position the display unit within a plane parallel to the display surface.

3. The display apparatus according to claim 2, wherein the connector comprises: an edge plate part located on a front side of the peripheral part of the display unit; and a protrusion which protrudes to a rear side of the edge plate part and has a side surface facing a side surface of the display unit to form the second positioning part.

4. The display apparatus according to claim 3, wherein the protrusion has a first guide part which is formed by chamfering a rear end portion thereof so as to guide an end portion of the display unit to a position in which the side surface of the end portion faces the side surface of the protrusion.

5. The display apparatus according to claim 4, wherein the frame member comprises: a front plate part facing the front side of the peripheral part of the display unit; and a side plate part which elongates from the front plate part to the rear side to face the side surface of the display unit, and
the connector includes a coupling part which is configured to be coupled with the side plate part and forms the coupling portion.

6. A television receiving apparatus comprising:
the display apparatus according to claim 4, and
a receiving unit which receives television broadcasts,
wherein the display apparatus is configured to display an image based on the television broadcasts received by the receiving unit.

7. The display apparatus according to claim 3, wherein the frame member comprises: a front plate part facing the front side of the peripheral part of the display unit; and a side plate part which elongates from the front plate part to the rear side to face the side surface of the display unit, and
the connector includes a coupling part which is configured to be coupled with the side plate part and forms the coupling portion.

8. A television receiving apparatus comprising:
the display apparatus according to claim 3, and
a receiving unit which receives television broadcasts,
wherein the display apparatus is configured to display an image based on the television broadcasts received by the receiving unit.

9. The display apparatus according to claim 2, wherein the frame member comprises: a front plate part facing the front side of the peripheral part of the display unit; and a side plate part which elongates from the front plate part to the rear side to face the side surface of the display unit, and
the connector includes a coupling part which is configured to be coupled with the side plate part and forms the coupling portion.

10. The display apparatus according to claim 9, wherein the coupling part protrudes in a direction parallel to or across the display surface so as to be overlapped on the side plate part, and has a through-hole for screwing.

11. The display apparatus according to claim 10, wherein the connector has a shield part configured to shield a portion in which the end portions of the front plate parts of the frame members are butted.

12. A television receiving apparatus comprising:
the display apparatus according to claim 10, and
a receiving unit which receives television broadcasts,
wherein the display apparatus is configured to display an image based on the television broadcasts received by the receiving unit.

13. The display apparatus according to claim 9, wherein the connector has a shield part configured to shield a portion in which the end portions of the front plate parts of the frame members are butted.

14. The display apparatus according to claim 13, wherein the shield part elongates inwardly along the display surface of the display unit from the second positioning part.

15. A television receiving apparatus comprising:
the display apparatus according to claim 9, and
a receiving unit which receives television broadcasts,
wherein the display apparatus is configured to display an image based on the television broadcasts received by the receiving unit.

16. The display apparatus according to claim 1, wherein the display unit comprises: a display surface on the front side thereof; and
an optical sheet disposed on the rear side thereof, and
the connector includes a third positioning part configured to position corner portions of the optical sheet.

17. The display apparatus according to claim 16, wherein the connector comprises: an edge plate part positioned on the front side of the peripheral part of the display unit; and a protrusion which protrudes to a rear side of the edge plate part and has a side surface facing a side surface of the display unit to position the display unit within the plane parallel to the display surface, and
the third positioning part is connected to the protrusion.

18. The display apparatus according to claim 17, wherein the third positioning part includes a second guide part configured to guide the display unit between the edge plate part and a front side thereof.

19. A television receiving apparatus comprising:
the display apparatus according to claim 1, and
a receiving unit which receives television broadcasts,
wherein the display apparatus is configured to display an image based on the television broadcasts received by the receiving unit.

20. A television receiving apparatus comprising:
the display apparatus according to claim 2, and
a receiving unit which receives television broadcasts,
wherein the display apparatus is configured to display an image based on the television broadcasts received by the receiving unit.

* * * * *